(12) United States Patent
Oh et al.

(10) Patent No.: US 12,396,321 B2
(45) Date of Patent: Aug. 19, 2025

(54) DISPLAY DEVICE

(71) Applicant: LG Display Co., Ltd., Seoul (KR)

(72) Inventors: Sanghoon Oh, Buan-gun (KR); NohJin Myung, Paju-si (KR); Seungkyu Lee, Bucheon-si (KR); Jieun Lee, Busan (KR); Eun Roh, Seoul (KR); Heeyeon Hwang, Hanam-si (KR)

(73) Assignee: LG Display Co., Ltd., Seoul (KR)

( * ) Notice: Subject to any disclaimer, the term of this patent is extended or adjusted under 35 U.S.C. 154(b) by 481 days.

(21) Appl. No.: 17/980,219

(22) Filed: Nov. 3, 2022

(65) Prior Publication Data

US 2023/0200110 A1 Jun. 22, 2023

(30) Foreign Application Priority Data

Dec. 21, 2021 (KR) .................. 10-2021-0184262

(51) Int. Cl.
*H10K 50/84* (2023.01)
*H10K 102/00* (2023.01)

(52) U.S. Cl.
CPC ....... *H10K 50/84* (2023.02); *H10K 2102/311* (2023.02)

(58) Field of Classification Search
CPC .................. H10K 50/84; H10K 2102/311
USPC ............................................. 257/40
See application file for complete search history.

(56) References Cited

U.S. PATENT DOCUMENTS

| 2016/0303843 A1* | 10/2016 | Jang | B32B 37/0084 |
| 2019/0067606 A1 | 2/2019 | Han et al. | |
| 2020/0052239 A1* | 2/2020 | Kim | H10K 50/841 |
| 2020/0198966 A1* | 6/2020 | Graf | B81C 1/00119 |

FOREIGN PATENT DOCUMENTS

| KR | 10-1888451 B1 | 8/2018 |
| KR | 10-2020-0053234 A | 5/2020 |

* cited by examiner

*Primary Examiner* — Xia L Cross
(74) *Attorney, Agent, or Firm* — Morgan, Lewis & Bockius LLP

(57) ABSTRACT

Provided is a display device. The display device includes a display panel; a support substrate supporting the display panel below the display panel and including a plurality of opening patterns; and an adhesive layer which is disposed on the support substrate and includes a plurality of first areas provided so as to correspond to each of the plurality of opening patterns and a second area enclosing the plurality of first areas and having a Young's modulus lower than that of the plurality of first areas. Each of the first area is larger than the corresponding opening pattern.

16 Claims, 5 Drawing Sheets

DISPLAY DEVICE

CROSS-REFERENCE TO RELATED APPLICATIONS

This application claims the priority of Korean Patent Application No. 10-2021-0184262 filed on Dec. 21, 2021, in the Korean Intellectual Property Office, the disclosure of which is incorporated herein by reference.

BACKGROUND

Technical Field

The present disclosure relates to a display device, and more particularly, to a flexible display device which has an excellent mechanical property, an improved appearance quality, and an improved folding reliability.

Discussion of the Related Art

Recently, as it enters an information era, a display field which visually expresses electrical information signals has been rapidly developed and in response to this, various display devices having excellent performances such as thin-thickness, light weight, and low power consumption have been developed. Specific examples of such a display device include a liquid crystal display device (LCD), a plasma display panel device (PDP), a field emission display device (FED), and an organic light emitting display device (OLED).

In the meantime, efforts are being continued to diversify a shape and a size of the display device. For example, display devices having various shapes, such as a curved display device having a curved surface or a flexible display device which maintains its display performance even in a bent or curved state, are consistently being developed. A display panel of the flexible display device uses a flexible substrate so that a support substrate such as a back plate is disposed below the display panel to suppress the sagging of the display panel and protect the display panel from foreign substances and impact from the outside.

SUMMARY

Accordingly, embodiments of the present disclosure are directed to a display device that substantially obviates one or more of the problems due to limitations and disadvantages of the related art.

An aspect of the present disclosure is to provide a display panel which improves the problem in that the opening pattern of the support substrate is seen from the display panel and minimizes a folding stress.

Another aspect of the present disclosure is to provide a display device which improves an appearance quality degradation due to the leakage of the adhesive layer through the opening pattern of the support substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a display panel, a support substrate supporting the display panel below the display panel and including a plurality of opening patterns; and an adhesive layer which is disposed on the support substrate and includes a plurality of first areas provided so as to correspond to each of the plurality of opening patterns and a second area enclosing the plurality of first areas and having a Young's modulus lower than that of the plurality of first areas, and the first area is larger than the opening pattern.

Other detailed matters of the exemplary embodiments are included in the detailed description and the drawings.

According to the present disclosure, the adhesive layer is partially secondarily cured to form a first area having a high Young's modulus in the adhesive layer so as to correspond to the opening pattern of the support substrate to minimize the transferring of the opening pattern onto the display panel so that the shape of the opening pattern is visible to the user and relieve the folding stress through the second area having a low Young's modulus.

According to the present disclosure, the first area having a high Young's modulus in the adhesive layer is disposed so as to correspond to the opening pattern to solve the problem in that the adhesive layer is leaked through the opening pattern.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
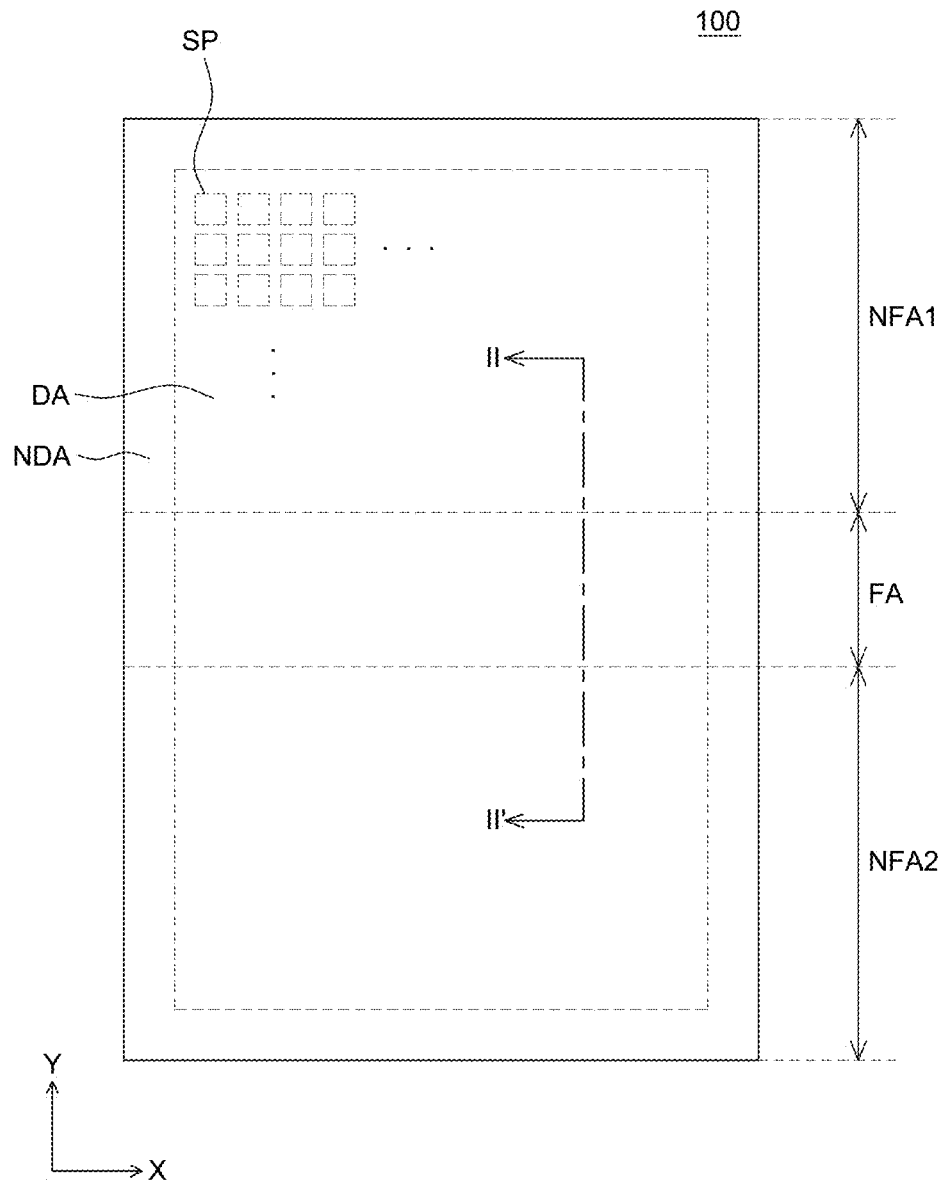
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
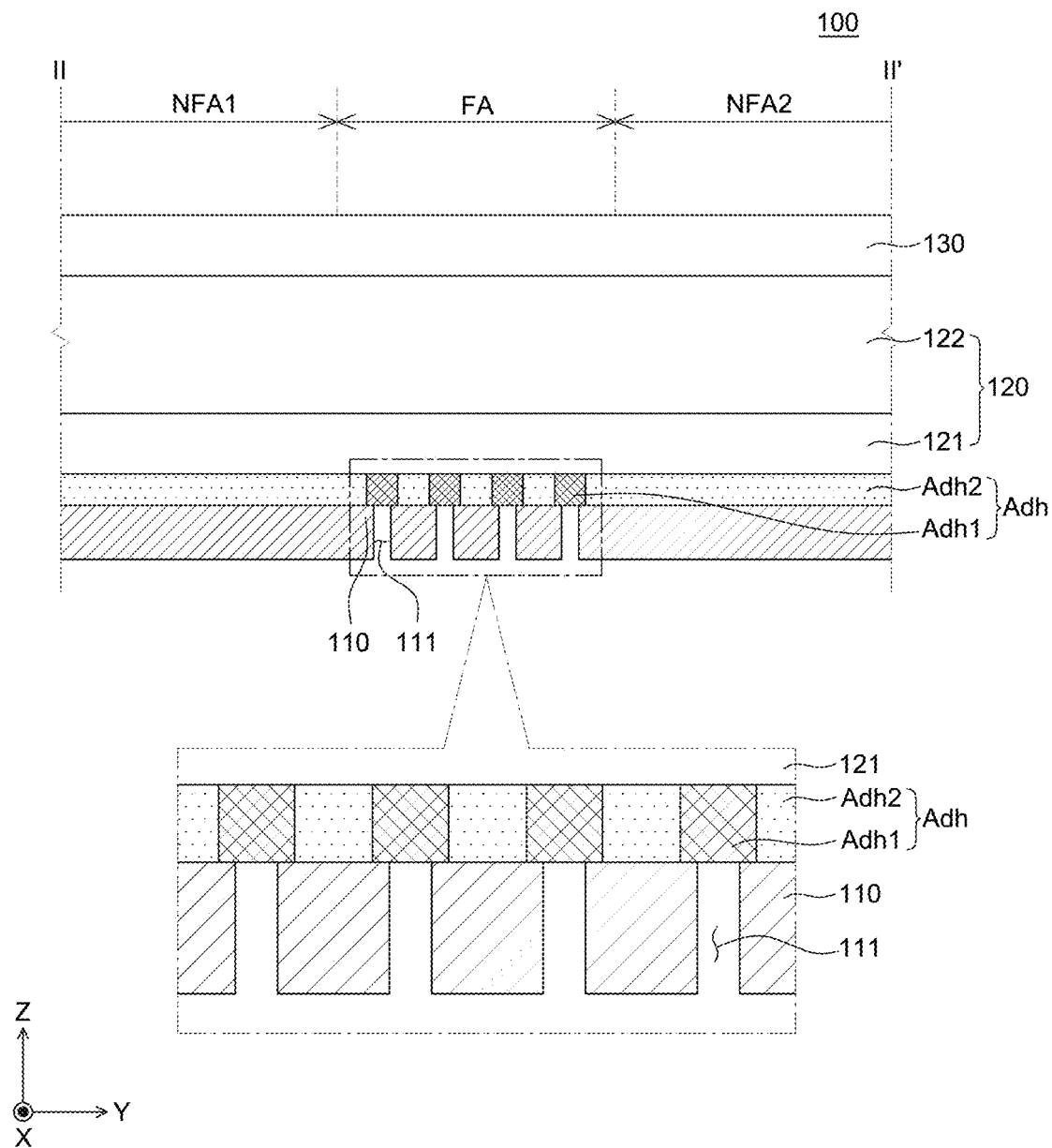
FIG. 2 is a schematic cross-sectional view taken along the line II-II' of FIG. 1.

FIG. 1 is a schematic plan view of a display device according to an exemplary embodiment of the present disclosure. FIG. 2 is a schematic cross-sectional view taken along the line II-II' of FIG. 1

Referring to FIGS. 1 and 2, the display device 100 according to the exemplary embodiment of the present disclosure includes a support substrate 110, a display panel 120, and a cover member 130. Hereinafter, for the convenience of description, the display device 100 according to the exemplary embodiment of the present disclosure is assumed as an organic light emitting display device, but it is not limited thereto.

The display panel 120 includes a display area DA and a non-display area NDA. Further, the display panel 120 includes a folding area FA and non-folding areas NFA1 and NFA2. The display panel 120 may be divided into a display area DA and the non-display area NDA depending on whether to display images and may be divided into a folding area FA and a non-folding area NFA depending on whether to be foldable. Therefore, a partial area of the display panel 120 may be a display area DA and a folding area FA and the other partial area of the display panel 120 may be a non-display area NDA and the non-folding area NFA.

In the meantime, for the convenience of description, it is assumed that the display device 100 according to the exemplary embodiment of the present disclosure is a foldable display device in which the folding area FA is disposed in only a partial area of the display area DA. However, the display device 100 according to the exemplary embodiment of the present disclosure may be a flexible or rollable display device in which the display areas DA of the display panel 120 are folding areas FA, but is not limited thereto.

The display area DA is an area where a plurality of pixels is disposed to substantially display images. In the display area DA, a plurality of pixels which includes an emission area to display images, a thin film transistor for driving the pixels, and a capacitor may be disposed. One pixel may include a plurality of sub pixels SP. The sub pixel SP is a minimum unit which configures the display area and each sub pixel SP may be configured to emit light of a specific wavelength band. For example, each of the sub pixels SP may be configured to emit red light, green light, blue light, or white light.

The non-display area NDA is disposed so as to enclose the display area DA. The non-display area NDA is an area where images are not substantially displayed and various wiring lines and driving ICs for driving the pixels and the driving elements disposed in the display area DA are disposed therein.

As described above, the display panel 120 may be defined as a folding area FA and non-folding areas NFA1 and NFA2 depending on whether to be foldable. The display panel 120 includes one folding area FA which is foldable and non-folding areas NFA1 and NFA2 excluding the folding area. The folding area FA is an area which is folded when the flexible display device 100 is folded and is folded with a specific radius of curvature with respect to a folding axis. For example, the folding axis of the folding area FA may be formed in an X-axis direction and the non-folding areas NFA1 and NFA2 may extend from the folding area FA in a Y-axis direction which is perpendicular to the folding axis. When the folding area FA is folded with respect to the folding axis, the folding area FA may form a part of a circle or an oval. At this time, a radius of curvature of the folding area FA may refer to a radius of a circle or an oval formed by the folding area FA.

The non-folding areas NFA1 and NFA2 are areas which are not folded when the flexible display device 100 is folded. That is, the non-folding areas NFA1 and NFA2 maintain a flat state when the flexible display device 100 is folded. The non-folding areas NFA1 and NFA2 may be located on both sides of the folding area FA. That is, the non-folding areas NFA1 and NFA2 may be areas extending to the Y-axis direction which is perpendicular to the folding axis. At this time, the folding area FA may be defined between the non-folding areas NFA1 and NFA2. Further, when the flexible display device 100 is folded with respect to the folding axis, the non-folding areas NFA1 and NFA2 may overlap each other.

The display panel 120 includes a flexible substrate 121 and a display element 122.

The flexible substrate 121 supports various elements which configure the display panel 120. The flexible substrate 121 may be a plastic substrate having a flexibility. For example, the plastic substrate may be a polymer material selected from polyimide, polyamide imide, polyethersulfone, polyethylene terephthalate, and polycarbonate, but is not limited thereto.

The plastic substrate has a relatively weak barrier characteristic against moisture or oxygen so that in order to compensate therefor, the plastic substrate may have a structure in which a plastic film and an inorganic layer are laminated. For example, the flexible substrate 121 may have a multi-layered structure in which a first plastic film, an inorganic layer, and a second plastic film are sequentially laminated, but is not limited thereto.

The flexible substrate 121 has an excellent folding characteristic, but has a thin thickness and has a rigidity lower than that of a glass substrate or a metal substrate so that it is difficult to maintain a constant shape during the folding and thus, a sagging phenomenon may occur. Therefore, in order to support the flexible substrate 121 and improve the impact resistance, the support substrate 110 is disposed below the display panel 120.

The support substrate 110 is disposed below the display panel 120 to support the display panel 120 and protect the display panel 120 from moisture or foreign substances permeating from the outside and external impacts. The support substrate 110 will be described in more detail below.

A driving thin film transistor for driving the display element 122 may be disposed on the flexible substrate 121. The driving thin film transistor may be disposed in each of the plurality of pixel areas. For example, the driving thin film transistor includes a gate electrode, an active layer, a source electrode, and a drain electrode. The driving thin film transistor may further include a gate insulating layer which insulates the gate electrode from the active layer and an interlayer insulating layer which insulates the gate electrode from the source electrode and the drain electrode.

A planarization layer may be disposed on the driving thin film transistor to planarize an upper surface.

The display element 122 may be disposed on the planarization layer. The display element 122 may be an organic light emitting diode. The organic light emitting diode may include an anode, a cathode, and an organic light emitting layer disposed therebetween. In the organic light emitting diode, holes injected from the anode and electrons injected from the cathode are coupled on the organic light emitting layer to emit light. The image may be displayed using the light emitted as described above.

The cover member 130 is disposed on the display element 122. The cover member 130 protects the display panel 120 from the external impact and scratches. Therefore, the cover member 130 may be formed of a material which is transparent and has excellent impact resistance and scratch resistance. Further, the cover member 130 protects the display panel 120 from the moisture permeating from the outside. When the moisture permeates from the outside, the display panel 120 is deteriorated so that the display quality may be degraded.

For example, the cover member 130 may be a film formed of a polymer, such as polyimide, polyamide imide, polyethylene terephthalate, polymethyl methacrylate, polypropylene glycol, and polycarbonate. As another example, the cover member may be a film formed of a photoisotropic polymer such as cycloolefin (co)polymer, photoisotropic polycarbonate, or photoisotropic polymethyl methacrylate.

Further, the cover member 130 may have a multi-layered structure in which various functional layers are laminated. For example, the cover member 130 may include various functional layers such as external light reflection reducing layer, a UV blocking layer, or a hard coating layer.

Hereinafter, the support substrate 110 and an adhesive layer Adh will be described in detail with reference to FIGS. 3 and 4 together.

Figure 3:
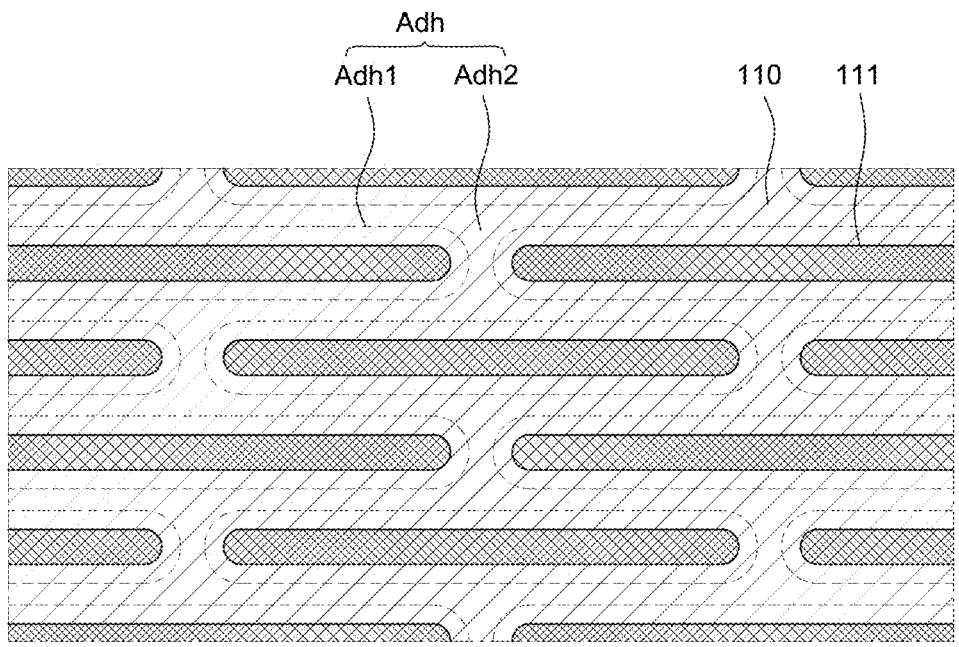
FIG. 3 is an enlarged plan view of an adhesive layer and a support substrate of a display device according to the exemplary embodiment of the present disclosure.

FIG. 3 is an enlarged plan view of an adhesive layer and a support substrate of a display device according to the exemplary embodiment of the present disclosure. FIG. 4 is a cross-sectional view for explaining an adhesive layer and a support substrate of a display device according to an exemplary embodiment of the present disclosure. For the convenience of description, in FIG. 3, only the support substrate 110 and the adhesive layer Adh, among the components of the display device 100, are illustrated and in FIG. 4, the support substrate 110, the adhesive layer Adh, and the flexible substrate 121, among the components of the display device 100, are illustrated. At this time, in FIG. 4, a reference character A denotes a distance between one opening pattern 111 and another adjacent opening pattern 111 in the support substrate 110, B denotes a width of a first area Adh1 overlapping the support substrate 110, C denotes a width of a second area Adh2 disposed between the plurality of first areas Adh1. Further, D denotes a thickness of the adhesive layer Adh.

Referring to FIGS. 2 and 3 together, the support substrate 110 is disposed below the display panel 120 to support the display panel 120. That is, the support substrate 110 is disposed on a rear surface of the flexible substrate 121 to suppress the sagging or deformation of the flexible substrate 121 and protect the display panel 120 from the external impact or foreign substances.

The support substrate 110 may be bonded to the display panel 120 by means of an adhesive layer Adh to be described below. That is, the support substrate 110 is attached onto the rear surface of the flexible substrate 121 by the adhesive layer Adh. The support substrate 110 serves to substantially support the display panel 120. The support substrate 110 may be a plate which is foldable and has an excellent rigidity. The support substrate 110 may be formed with a material having a rigidity larger than that of the flexible substrate 121 to support the display panel 120.

For example, the support substrate 110 may be a metal plate including a metal such as stainless steel (SUS), invar, aluminum or magnesium. The metal plate has excellent rigidity and impact resistance and an excellent restoring force. When the support substrate 110 is formed of a metal material having an excellent rigidity as described above, even though the thickness thereof is reduced, the mechanical property such as a rigidity is maintained to firmly support the display panel 120. Therefore, the thickness may be significantly reduced as compared with the support substrate formed of a polymer material of the related art. The thickness of the support substrate 110 is minimized to reduce the stress which is applied to the support substrate 110 or the display panel 120 during the folding and thus the folding reliability is improved and the folding characteristic is improved. Further, a flexible display device having a larger curvature as compared with the related art may be implemented and further, a multi-foldable display device or a rollable display device is also implemented. Further, the support substrate 110 formed of the metal material as described above has an excellent restoring force so that even during the repeated folding, the deformation such as plastic deformation is not caused so that the appearance defect may be improved.

For example, a thickness of the support substrate 110 may be 90 µm to 220 µm. When the thickness of the support substrate 110 is smaller than 90 µm, the support substrate is too thin so that the support substrate cannot effectively support the display panel 120 to be sagged. Further, if the thickness of the support substrate 111 is larger than 220 µm, when the flexible display device 100 is folded, a stress applied to the display panel 120 is increased, which causes the crack and reduces the restoring force to cause the plastic deformation, and does not satisfy the folding reliability.

The support substrate 110 includes a plurality of opening patterns 111. For the convenience of description, even though in FIG. 2, it is illustrated that four opening patterns 111 are formed, it is not limited thereto.

The plurality of opening patterns 111 may be formed on the support substrate 110 so as to correspond to the folding area FA. That is, the plurality of opening patterns 111 may be holes which pass through the support substrate 110 in a thickness direction. When the display device 100 is folded, the stress is concentrated on the folding area FA. The plurality of opening patterns 111 may disperse the stress concentrated on the folding area FA during the folding. As described above, as the plurality of opening patterns 111 is formed in a position corresponding to the folding area FA, it is advantageous in that the display device 100 is easily folded and the restoring force is excellent.

Referring to FIG. 3, each of the plurality of opening patterns 111 may be formed to extend along a direction parallel to the folding axis to be long. That is, each of the plurality of opening patterns 111 may be formed to be elongated along the same direction as the folding axis. Accordingly, each of the plurality of opening patterns 111 may be formed to be parallel to the folding axis with a bar shape in the plan view.

Each of the plurality of opening patterns 111 may continuously extend to the non-display area across the display area FA without being disconnected, along the same direction as the folding axis, but is not limited thereto.

Even though in FIG. 3, it is illustrated that the plurality of opening patterns 111 has an oval cross-section, it is not limited thereto. The cross-sectional shape of each of the plurality of opening patterns 111 may be formed with various shapes such as a polygonal shape other than a semicircular shape or a quadrangular shape.

The adhesive layer Adh is disposed on the support substrate 110 to bond the support substrate 110 and the flexible substrate 121. Therefore, the adhesive layer Adh may bond the support substrate 110 and the display panel 120.

Figure 4:
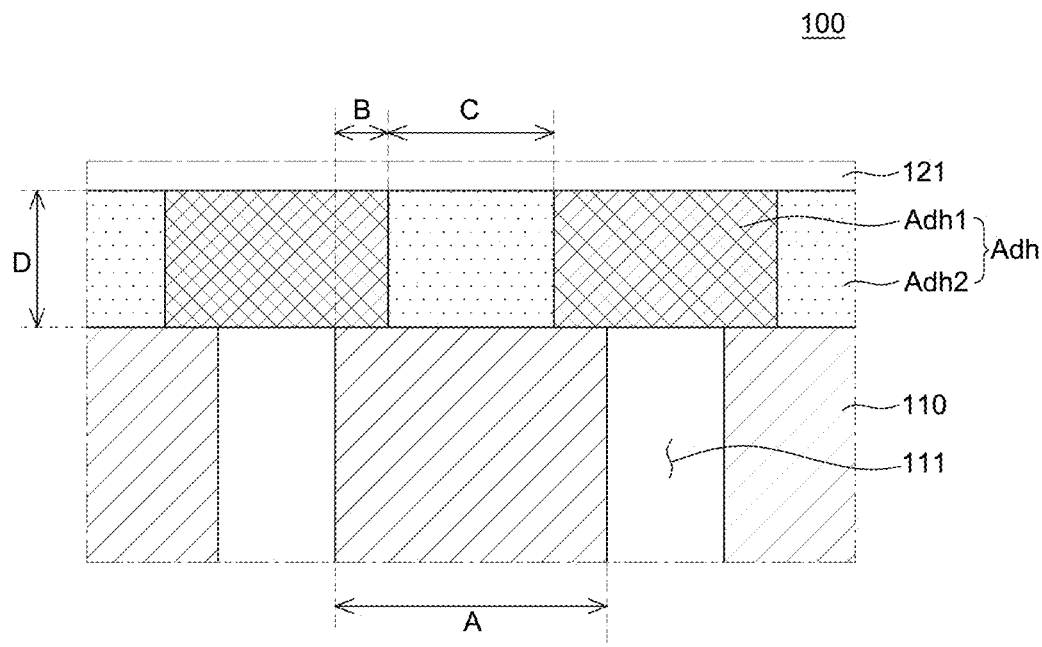
FIG. 4 is a cross-sectional view for explaining an adhesive layer and a support substrate of a display device according to an exemplary embodiment of the present disclosure.

Even though in FIGS. 2 and 4, it is illustrated that the flexible substrate 121 is disposed on the adhesive layer Adh, a back plate may be further disposed on the adhesive layer Adh. The back plate may be further disposed between the display panel 120 and the support substrate 110, that is, between the flexible substrate 121 disposed on the rear surface of the display panel 120 and the adhesive layer Adh disposed on the support substrate 110. Therefore, the adhesive layer Adh is disposed to bond the support substrate 110 and the back plate, but is not limited thereto.

The back plate may be included to support the display panel 120 between the display panel 120 and the support substrate 110 together with the support substrate 110 and may be referred to as a top plate. When the display device 100 is folded, the back plate maintains the curvature of the display panel 120 to be constant and suppresses the crease generated on the upper surface of the display panel 120. Further, the back plate is disposed between the display panel 120 and the support substrate 110 to suppress the transferring the boundary of the opening patterns 111 onto the display panel 120 so that the shape of the opening patterns 111 is visible to the user or distortion of the displayed screen due to the plurality of opening patterns 111 provided so as to correspond to the folding area FA of the support substrate 110.

The adhesive layer Adh may be formed of a photo curable material. For example, the adhesive layer Adh is a layer formed of a polymer and is formed using an ultraviolet (UV) curable resin, but is not limited thereto.

Referring to FIGS. 2 and 3, the adhesive layer Adh includes a first area Adh1 and a second area Adh2.

The first area Adh1 may be an area formed by further partially curing the adhesive layer Adh. At this time, the Young's modulus of the first area may be $1 \times 10^8$ or higher.

Referring to FIGS. 2 to 4, the first area Adh1 may be provided in the adhesive layer Adh so as to correspond to each of the plurality of opening patterns 111. The first area Adh1 may be larger than the opening pattern 111 and a lower surface of the first area Adh1 may have the same shape as the opening pattern 111.

Referring to FIGS. 2 to 4, the second area Adh2 is disposed to enclose the plurality of first areas Adh1. The second area Adh2 is a remaining part of the adhesive layer Adh which is not cured when the first area Adh1 is formed. Therefore, the Young's modulus of the second area Adh2 may be lower than that of the first area Adh1. Specifically, the Young's modulus of the second area Adh2 may be $1 \times 10^4$ to $9 \times 10^6$ Pa.

For example, the first area Adh1 may be an area formed by curing the adhesive layer Adh by light which passes through the opening pattern 111 from the lower direction of the support substrate 110 to be irradiated onto the adhesive layer Adh. Therefore, the lower surface of the first area Adh1 may have the same shape as the opening pattern 111. At this time, the UV light irradiated onto the adhesive layer Adh from the lower direction of the opening pattern 111 is diffracted by the opening pattern 111 so that an area larger than the opening pattern 111 may be cured. Therefore, the first area Adh1 may be formed to be larger than the opening pattern 111.

Referring to FIGS. 2 to 4, at least a part of the lower surface of the first area Adh1 may overlap the support substrate 110. An upper surface of the first area Adh1 is disposed on the same plane as the upper surface of the adhesive layer Adh and an area of the lower surface of the first area Adh1 may be larger than the corresponding opening pattern 111. The lower surface of the first area Adh1 may have the same size as the upper surface of the first area Adh1. That is, the first area Adh1 may be disposed to fully cover the opening pattern 111 of the support substrate 110. Therefore, the first area Adh1 is disposed on the support substrate 110 as a partition shape so that the second area Adh2 may be configured to be confined between the plurality of first areas Adh1 on the support substrate 110.

In the display device 100 according to the exemplary embodiment of the present disclosure, desirably, a width B of a part of the first area Adh1 overlapping the support substrate 110 may be equal to or larger than a thickness D of the adhesive layer Adh and equal to or smaller than 40% of the distance A between one opening pattern 111 and another adjacent opening pattern 111 in the support substrate 110. Therefore, the first area Adh1 may be disposed to stably fully cover the opening pattern 111 of the support substrate 110.

In the display device 100 according to the exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display surface is improved and the folding stress is also minimized.

In the related art, in order to disperse the folding stress concentrated on the folding area, opening patterns, that is, a plurality of holes is formed on the support substrate. However, in this case, the folding stress is dispersed to satisfy the folding reliability, but the visibility of the opening pattern is increased so that the appearance quality is deteriorated.

In the display device 100 according to the exemplary embodiment of the present disclosure, on the adhesive layer Adh in the position corresponding to the plurality of opening patterns 111, the first area Adh1 having a higher Young's modulus than the other parts is formed. The transferring of the opening pattern 111 onto the display panel 120 may be minimized. That is, the plurality of opening patterns 111 formed in the folding area FA may not be visible to the user. Therefore, the appearance quality degradation problem in that the opening pattern 111 is visible from the display panel may be solved.

In the display device 100 according to the exemplary embodiment of the present disclosure, the second area Adh2 having a Young's modulus lower than that of the first area Adh1 is disposed so as to enclose the plurality of first areas Adh1 of the adhesive layer Adh. Therefore, when the display device 100 is folded, the folding stress which is applied to the first area Adh1 having a higher Young's modulus may be relived. Accordingly, the concentration of the folding stress may be relived by the first area Adh1 which is configured to have a higher Young's modulus to minimize the transferring of the opening pattern 111 in the display device 100 according to the exemplary embodiment of the present disclosure.

In the display device 100 according to the exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display panel is improved and the folding stress is also relived so that the appearance quality of the display device 100 is improved.

In the meantime, in the display device 100 according to the exemplary embodiment of the present disclosure, the first area Adh1 is disposed so as to correspond to the opening pattern 111 so that the leakage of the adhesive layer Adh through the opening pattern 111 may be improved.

In the display device of the related art, when the display device is folded, the stress is concentrated on the adhesive layer and the adhesive layer is leaked through the opening pattern so that the appearance quality of the display device may be degraded.

Therefore, in the display device 100 according to the exemplary embodiment of the present disclosure, the first area Adh1 having a higher Young's modulus is disposed in the adhesive layer Adh in the position corresponding to the opening pattern 111. Further, as illustrated in FIGS. 2 to 4, the first area Adh1 is disposed so as to fully cover the opening pattern 111 so that the second area Adh2 is confined between the first areas Adh1. Therefore, in the adhesive layer Adh, the flow of the second area Adh2 having a lower Young's modulus is restricted and the second area Adh2 may be configured so as not to be leaked through the opening pattern 111. Accordingly, in the display device 100 according to the exemplary embodiment of the present disclosure, the first area Adh1 having a higher Young's modulus is disposed so as to correspond to the opening pattern 111 so that the leakage of the adhesive layer Adh through the opening pattern 111 may be improved. As a result, the defective appearance quality of the display device 100 may be improved.

In the meantime, the display device 100 according to the present disclosure may be implemented as a display device having the folding area FA with a large curvature of 3R or less, and further 1.5R or less. Further, even though the curvature is increased, the folding reliability is satisfied so that it is possible to be implemented as a multi-foldable display device. In the present specification, the radius of curvature 1R means that a radius of a curved surface of the folding area during the folding is 1 mm.

Figure 5:
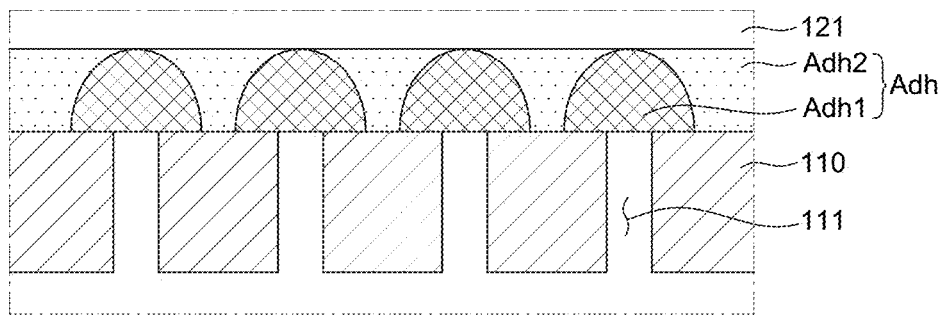
FIG. 5 is a schematic cross-sectional view of a display device according to another exemplary embodiment of the present disclosure.

FIG. 5 is a schematic cross-sectional view of a display device according to another exemplary embodiment of the present disclosure. For the convenience of description, in FIG. 5, among components of a display device 500, only a support substrate 110, an adhesive layer Adh, and a flexible substrate 121 are illustrated. The only difference between the display device 500 of FIG. 5 and the display device 100 of FIGS. 1 to 4 is a first area Adh1 of the adhesive layer Adh, but the other configurations are substantially the same, so that a redundant description will be omitted.

The adhesive layer Adh includes a first area Adh1 and a second area Adh2.

The first area Adh1 may be an area formed by further partially curing the adhesive layer Adh. The first area Adh1 may be provided in the adhesive layer Adh1 so as to correspond to each of the plurality of opening patterns 111. The first area Adh1 may be larger than the opening pattern 111 and a lower surface of the first area Adh1 may have the same shape as the opening pattern 111.

The second area Adh2 is disposed so as to enclose the plurality of first areas Adh1. The second area Adh2 is a remaining part of the adhesive layer Adh which is not cured when the first area Adh1 is formed. Therefore, the Young's modulus of the second area Adh2 may be lower than that of the first area Adh1.

Referring to FIG. 5, in the display device 500 according to another exemplary embodiment of the present disclosure, a lower surface of the first area Adh1 may be larger than an upper surface of the first area Adh1. A shape of the first area Adh1 may be a semicircular shape, as illustrated in FIG. 5, but may also be a trapezoidal shape, and is not limited thereto.

In the display device 500 according to another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display surface is improved and the folding stress is also relived.

In the related art, in order to disperse the folding stress concentrated on the folding area, opening patterns, that is, a plurality of holes is formed on the support substrate. However, in this case, the folding stress is dispersed to satisfy the folding reliability, but the visibility of the opening pattern is increased so that the appearance quality is deteriorated.

In the display device 500 according to another exemplary embodiment of the present disclosure, on the adhesive layer Adh in the position corresponding to the plurality of opening patterns 111, the first area Adh1 having a higher Young's modulus than the other parts is formed. The transferring of the opening pattern 111 thereonto may be minimized. That is, the plurality of opening patterns 111 formed in the folding area FA may not be visible to the user. Therefore, the appearance quality degradation problem in that the opening pattern 111 is visible from the display panel may be solved.

Further, in the display device 500 according to another exemplary embodiment of the present disclosure, the second area Adh2 having a Young's modulus lower than that of the first area Adh1 so as to enclose the plurality of first areas Adh1 of the adhesive layer and the lower surface of the first area Adh1 is configured to be larger than the upper surface of the first area. Therefore, when the display device 500 is folded, the folding stress which is applied to the first area Adh1 having a higher Young's modulus may be further effectively relived. Accordingly, the concentration of the folding stress may be relived by the first area Adh1 which is configured to have a higher Young's modulus to minimize the transferring of the opening pattern 111 in the display device 500 according to another exemplary embodiment of the present disclosure.

In the display device 500 according to another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display panel is improved and the folding stress is also more effectively relived so that the appearance quality of the display device 500 is improved.

Figure 6:
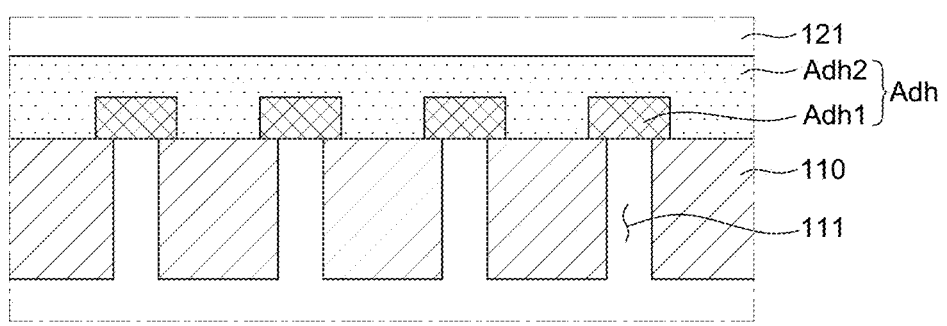
FIG. 6 is a schematic cross-sectional view of a display device according to still another exemplary embodiment of the present disclosure.

FIG. 6 is a schematic cross-sectional view of a display device according to still another exemplary embodiment of the present disclosure. For the convenience of description, in FIG. 6, among components of a display device 600, only a support substrate 110, an adhesive layer Adh, and a flexible substrate 121 are illustrated. The only difference between the display device 600 of FIG. 6 and the display device 100 of FIGS. 1 to 4 is a first area Adh1 of the adhesive layer Adh, but the other configurations are substantially the same, so that a redundant description will be omitted.

Referring to FIG. 6, in the display device 600 according to another exemplary embodiment of the present disclosure, an upper surface of the first area Adh1 may be disposed to be lower than an upper surface of the adhesive layer Adh. That is, the second area Adh2 having a Young's modulus lower than that of the first area Adh1 may be disposed above the first area Adh1.

In the display device 600 according to still another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display surface is improved and the folding stress is also relived.

In the related art, in order to disperse the folding stress concentrated on the folding area, opening patterns, that is, a plurality of holes is formed on the support substrate. However, in this case, the folding stress is dispersed to satisfy the folding reliability, but the visibility of the opening pattern is increased so that the appearance quality is deteriorated.

In the display device 600 according to still another exemplary embodiment of the present disclosure, on the adhesive layer Adh in the position corresponding to the plurality of opening patterns 111, the first area Adh1 having a higher Young's modulus than the other parts is formed. The transferring of the opening pattern 111 onto the display panel 120 so that the shape of the opening 111 is visible to the user may be minimized. That is, the plurality of opening patterns 111 formed in the folding area FA may not be visible to the user. Therefore, the appearance quality degradation problem in that the opening pattern 111 is visible from the display panel may be solved.

Further, in the display device 600 according to still another exemplary embodiment of the present disclosure, the second area Adh2 having a Young's modulus lower than that of the first area Adh1 so as to enclose the plurality of first areas Adh1 of the adhesive layer. Further, the second area Adh2 having a Young's modulus lower than that of the first area Adh1 is disposed above the first area. Therefore, when the display device 600 is folded, the folding stress which is applied to the first area Adh1 having a higher Young's modulus may be further effectively relived. Accordingly, the concentration of the folding stress may be relived by the first area Adh1 which is configured to have a higher Young's modulus to minimize the transferring of the opening pattern 111 in the display device 600 according to still another exemplary embodiment of the present disclosure.

Accordingly, in the display device 600 according to still another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display panel is improved and the folding stress is also more effectively relived so that the appearance quality of the display device 600 is improved.

Figure 7:
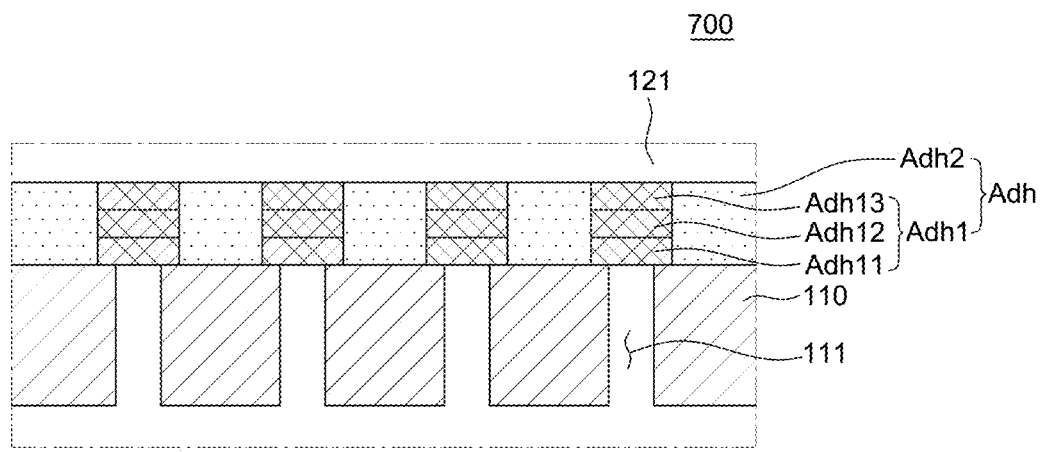
FIG. 7 is a schematic cross-sectional view of a display device according to still another exemplary embodiment of the present disclosure.

FIG. 7 is a schematic cross-sectional view of a display device according to still another exemplary embodiment of the present disclosure. For the convenience of description, in FIG. 7, among components of a display device 700, only a support substrate 110, an adhesive layer Adh, and a flexible substrate 121 are illustrated. The only difference between the display device 700 of FIG. 7 and the display device 100 of FIGS. 1 to 4 is a first area Adh1 of the adhesive layer Adh, but the other configurations are substantially the same, so that a redundant description will be omitted.

Referring to FIG. 7, in the display device 700 according to still another exemplary embodiment of the present disclosure, the Young's modulus of the first area Adh1 may be increased from the support substrate 110 to the display panel 120.

Specifically, the first area Adh1 may include a plurality of areas Adh11, Adh12, and Adh13 having different Young's moduli. The first area Adh1 includes a first Young's modulus area Adh11, a second Young's modulus area Adh12, and a third Young's modulus area Adh13. The first Young's modulus area Adh11 is disposed to be most adjacent to the support substrate 110 and has a lowest Young's modulus. The second Young's modulus area Adh12 is disposed on the first Young's modulus area Adh11 and has a second highest Young's modulus. The third Young's modulus area Adh13 is disposed on the second Young's modulus area Adh12 and has the highest Young's modulus. Therefore, the Young's modulus of the first area Adh1 may be increased from the support substrate 110 to the display panel 120.

In the display device 700 according to still another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display surface is improved and the folding stress is also relived.

In the related art, in order to disperse the folding stress concentrated on the folding area, opening patterns, that is, a plurality of holes is formed on the support substrate. However, in this case, the folding stress is dispersed to satisfy the folding reliability, but the visibility of the opening pattern is increased so that the appearance quality is deteriorated.

In the display device 700 according to still another exemplary embodiment of the present disclosure, on the adhesive layer Adh in the position corresponding to the plurality of opening patterns 111, the first area Adh1 having a higher Young's modulus than the other parts is formed. The transferring of the opening pattern 111 thereonto may be minimized. That is, the plurality of opening patterns 111 formed in the folding area FA may not be visible to the user. Therefore, the appearance quality degradation problem in that the opening pattern 111 is visible from the display panel may be improved.

Further, in the display device 700 according to still another exemplary embodiment of the present disclosure, the second area Adh2 having a Young's modulus lower than that of the first area Adh1 so as to enclose the plurality of first areas Adh1 of the adhesive layer. The Young's modulus of the first area Adh1 is increased from the support substrate 110 to the display panel 120 so that when the display device 100 is folded, the folding stress which is applied to the first area Adh1 having a higher Young's modulus may be further effectively relived. Accordingly, the concentration of the folding stress may be relived by the first area Adh1 which is configured to have a higher Young's modulus to minimize the transferring of the opening pattern 111 in the display device 700 according to still another exemplary embodiment of the present disclosure.

Accordingly, in the display device 700 according to still another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display panel is improved and the folding stress is also more effectively relived so that the appearance quality of the display device 700 is improved.

Figure 8:
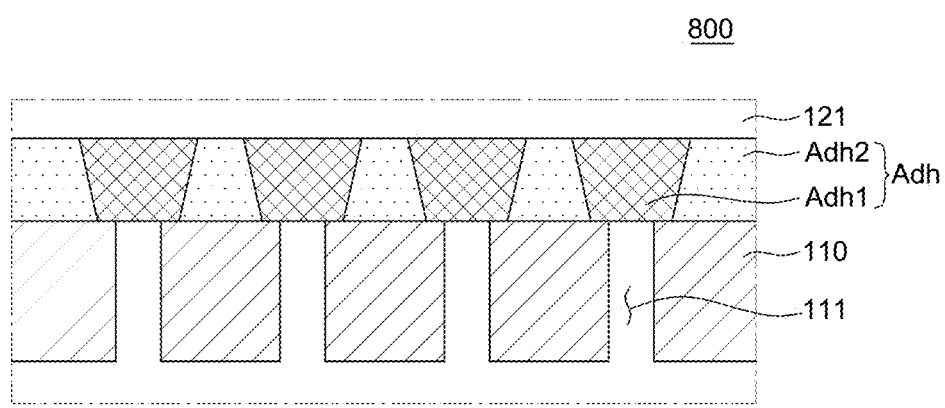
FIG. 8 is a schematic cross-sectional view of a display device according to still another exemplary embodiment of the present disclosure.

FIG. 8 is a schematic cross-sectional view of a display device according to still another exemplary embodiment of the present disclosure. For the convenience of description, in FIG. 8, among components of a display device 800, only a support substrate 110, an adhesive layer Adh, and a flexible substrate 121 are illustrated. The only difference between the display device 800 of FIG. 8 and the display device 100 of FIGS. 1 to 4 is a first area Adh1 of the adhesive layer Adh, but the other configurations are substantially the same, so that a redundant description will be omitted.

Referring to FIG. 8, in the display device 800 according to still another exemplary embodiment of the present disclosure, an upper surface of the first area Adh1 may be larger than a lower surface of the first area Adh1. That is, the cross section of the first pattern Adh1 may have an inverted tapered shape.

In the display device 800 according to still another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display surface is improved and the folding stress is also relived.

In the related art, in order to disperse the folding stress concentrated on the folding area, opening patterns, that is, a plurality of holes is formed on the support substrate. However, in this case, the folding stress is dispersed to satisfy the folding reliability, but the visibility of the opening pattern is increased so that the appearance quality is deteriorated.

In the display device 800 according to still another exemplary embodiment of the present disclosure, on the adhesive layer Adh in the position corresponding to the plurality of opening patterns 111, the first area Adh1 having a higher Young's modulus than the other parts is formed. The transferring of the opening pattern 111 thereonto may be minimized. That is, the plurality of opening patterns 111 formed in the folding area FA may not be visible to the user. Therefore, the appearance quality degradation problem in that the opening pattern 111 is visible from the display panel may be improved.

In the display device 800 according to still another exemplary embodiment of the present disclosure, the second area Adh2 having a Young's modulus lower than that of the first area Adh1 so as to enclose the plurality of first areas Adh1 of the adhesive layer. Therefore, when the display device 800 is folded, the folding stress which is applied to the first area Adh1 having a higher Young's modulus may be relived. Accordingly, the concentration of the folding stress may be relived by the first area Adh1 which is configured to have a higher Young's modulus to minimize the transferring of the opening pattern 111 in the display device 800 according to still another exemplary embodiment of the present disclosure.

Accordingly, in the display device 800 according to still another exemplary embodiment of the present disclosure, on the adhesive layer Adh in the position corresponding to the plurality of opening patterns 111, the first area Adh1 having a higher Young's modulus than the other parts is formed. Therefore, the phenomenon that the opening pattern 111 is visible from the display panel is improved and the folding stress is also relived so that the appearance quality of the display device 800 is improved.

The exemplary embodiments of the present disclosure can also be described as follows:

According to an aspect of the present disclosure, there is provided a display device. The display device comprises a display panel; a support substrate supporting the display panel below the display panel and including a plurality of opening patterns; and an adhesive layer which is disposed on the support substrate and includes a plurality of first areas provided so as to correspond to each of the plurality of opening patterns and a second area enclosing the plurality of first areas and having a Young's modulus lower than that of the plurality of first areas. The each of first areas is larger than the corresponding opening pattern.

an area of a lower surface of each of the first area may be larger than the corresponding opening pattern and at least a part of the lower surface of the first area overlaps the support substrate.

An upper surface of the first area may be disposed on the same plane as an upper surface of the adhesive layer.

The lower surface of the first area may have the same size as the upper surface of the first area.

The lower surface of the first area may be larger than the upper surface of the first area.

The upper surface of the first area may be larger than the lower surface of the first area.

The first area may have a hemispheric shape.

A Young's modulus of the first area may increase from the support substrate toward the display panel.

An upper surface of the first area may be disposed to be lower than the upper surface of the adhesive layer.

A lower surface of the first area of the adhesive layer disposed on the support substrate may have the same shape as the opening pattern.

A width of a first area overlapping the support substrate in the first area may be equal to or larger than the thickness of the adhesive layer and may be equal to or smaller than 40% of a distance between one opening pattern and another adjacent opening pattern in the support substrate.

A Young's modulus of the first area may be $1\times10^8$ and a Young's modulus of the second area may be $1\times10^4$ to $9\times10^6$.

The adhesive layer may be formed of a photo-curable material.

The first area may be formed by curing the adhesive layer by light which passes through the opening pattern from a lower direction of the support substrate to be irradiated onto the adhesive layer.

The display panel may include a folding area and a non-folding area and the opening patterns of the support substrate may be provided so as to correspond to the folding area of the display panel.

The display device may further comprise a back plate disposed between the display panel and the support substrate. The adhesive layer bonds the support substrate and the back plate.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel;
   a support substrate supporting the display panel below the display panel and including a plurality of opening patterns; and
   an adhesive layer which is disposed on the support substrate and includes a plurality of first areas provided so as to correspond to each of the plurality of opening patterns and a second area which enclosing the plurality of first areas and having a Young's modulus lower than that of the plurality of first areas,
   wherein each of the first areas is larger than the corresponding opening pattern.

2. The display device according to claim 1, wherein an area of a lower surface of each of the first areas is larger than the corresponding opening pattern and at least a part of the lower surface of the first area overlaps the support substrate.

3. The display device according to claim 2, wherein an upper surface of the first area is disposed on the same plane as an upper surface of the adhesive layer.

4. The display device according to claim 3, wherein the lower surface of the first area has the same size as the upper surface of the first area.

5. The display device according to claim 3, wherein the lower surface of the first area is larger than the upper surface of the first area.

6. The display device according to claim 3, wherein the upper surface of the first area is larger than the lower surface of the first area.

7. The display device according to claim 2, wherein the first area has a hemispheric shape.

8. The display device according to claim 1, wherein a Young's modulus of the first area increases from the support substrate toward the display panel.

9. The display device according to claim 1, wherein an upper surface of the first area is disposed to be lower than an upper surface of the adhesive layer.

10. The display device according to claim 1, wherein a lower surface of the first area of the adhesive layer disposed on the support substrate has the same shape as the opening pattern.

11. The display device according to claim 1, wherein a width of a part of the first area overlapping the support substrate is equal to or larger than a thickness of the adhesive layer and is equal to or smaller than 40% of a distance between one opening pattern and another adjacent opening pattern in the support substrate.

12. The display device according to claim 1, wherein a Young's modulus of the first area is $1\times10^8$ and a Young's modulus of the second area is $1\times10^4$ to $9\times10^6$.

13. The display device according to claim 1, wherein the adhesive layer is formed of a photo-curable material.

14. The display device according to claim 13, wherein the first area is formed by curing the adhesive layer by light which passes through the opening pattern from a lower direction of the support substrate to be irradiated onto the adhesive layer.

15. The display device according to claim 1, wherein the display panel includes a folding area and a non-folding area and the opening patterns of the support substrate are provided so as to correspond to the folding area of the display panel.

16. The display device according to claim 15, further comprising:
   a back plate disposed between the display panel and the support substrate,
   wherein the adhesive layer bonds the support substrate and the back plate.

* * * * *